(12) United States Patent
Lin et al.

(10) Patent No.: US 9,966,304 B2
(45) Date of Patent: May 8, 2018

(54) METHOD FOR FORMING INTERCONNECT STRUCTURE

(71) Applicant: TAIWAN SEMICONDUCTOR MANUFACTURING CO., LTD., Hsinchu (TW)

(72) Inventors: Yu-Hung Lin, Taichung (TW); Ching-Fu Yeh, Hsinchu (TW); Hsin-Chen Tsai, Hsinchu (TW); Yao-Hsiang Liang, Hsinchu (TW); Yu-Min Chang, Hsinchu (TW); Shih-Chi Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days. days.

(21) Appl. No.: 15/263,249

(22) Filed: Sep. 12, 2016

(65) Prior Publication Data

US 2016/0379875 A1    Dec. 29, 2016

Related U.S. Application Data

(62) Division of application No. 13/929,341, filed on Jun. 27, 2013, now abandoned.

(51) Int. Cl.
*H01L 21/768* (2006.01)
*H01L 23/532* (2006.01)

(52) U.S. Cl.
CPC .. *H01L 21/76846* (2013.01); *H01L 21/76876* (2013.01); *H01L 21/76879* (2013.01); *H01L 23/53233* (2013.01); *H01L 23/53238* (2013.01); *H01L 23/53266* (2013.01); *H01L 23/53228* (2013.01); *H01L 2924/0002* (2013.01)

(58) Field of Classification Search
CPC ......... H01L 21/76846; H01L 21/76876; H01L 21/76879; H01L 23/53266; H01L 23/53228; H01L 23/53233
See application file for complete search history.

(56) References Cited

U.S. PATENT DOCUMENTS

| | | | |
|---|---|---|---|
| 6,339,258 | B1 | 1/2002 | Cooney, III et al. |
| 6,992,390 | B2 | 1/2006 | Edelstein et al. |
| 7,071,564 | B1 | 7/2006 | Erb et al. |
| 7,875,977 | B2 | 1/2011 | Barth et al. |
| 8,148,257 | B1 | 4/2012 | Barth et al. |
| 2004/0131878 | A1 | 7/2004 | Seet et al. |
| 2005/0233159 | A1 | 10/2005 | Fartash |

(Continued)

FOREIGN PATENT DOCUMENTS

CN        1290940 A        4/2001

*Primary Examiner* — Peniel M Gumedzoe
(74) *Attorney, Agent, or Firm* — Maschoff Brennan

(57) ABSTRACT

An improved interconnect structure and a method for forming the interconnect structure is disclosed that allows the interconnect structure to achieve a lower Rc. To lower the Rc of the interconnect structure, an α-phase inducing metal layer is introduced on a first Ta barrier layer of β phase to induce the subsequent deposition of Ta thereon into the formation of an α-phase Ta barrier layer. The subsequently deposited Ta barrier layer with a primary crystallographic structure of α phase has a lower Rc than that of the β-phase Ta barrier layer.

20 Claims, 6 Drawing Sheets

(56) References Cited

U.S. PATENT DOCUMENTS

2007/0152342 A1* 7/2007 Tsao .................. H01L 21/76805
   257/774
2011/0266676 A1* 11/2011 Isobayashi ........ H01L 21/76831
   257/751

* cited by examiner

METHOD FOR FORMING INTERCONNECT STRUCTURE

REFERENCE TO RELATED APPLICATION

The present application is a divisional application of U.S. application Ser. No. 13/929,341 filed on Jun. 27, 2013. The entire disclosures of the above applications are hereby incorporated by reference herein.

BACKGROUND

The semiconductor integrated circuit (IC) industry has experienced rapid growth. Modern integrated circuits are made up of literally millions of active devices such as transistors and capacitors. Technological advances in IC materials and design have produced generations of ICs where each generation has smaller and more complex circuits than the previous generation. These devices are initially isolated from each other, but are later interconnected together through multiple metal layers to form functional circuits. As the IC becomes increasingly more complex, the interconnect structure also becomes more complex, resulting in increasing number of metal layers.

Typical interconnect structures include lateral interconnections, such as metal lines (wirings), and vertical interconnections, such as conductive vias and contacts. Complex interconnects can limit performance and the density of modern integrated circuits. Tantalum (Ta) has been used as a barrier layer material around copper conductors to block the diffusion of conductive copper into a surrounding interlayer dielectric (ILD) layer. Copper readily diffuses during operation in a phenomenon known as electromigration. Electromigration can produce tendrils that can short adjacent conductive features. However, Ta as deposited using current techniques exhibits a contact resistivity (Rc) that is much higher than that of copper. Thus, the Ta barrier layer limits the overall line resistance. Hence, what is needed are structures and methods of forming an interconnect structure with the blocking advantage of Ta barrier layer without disadvantage of lower Rc performance.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
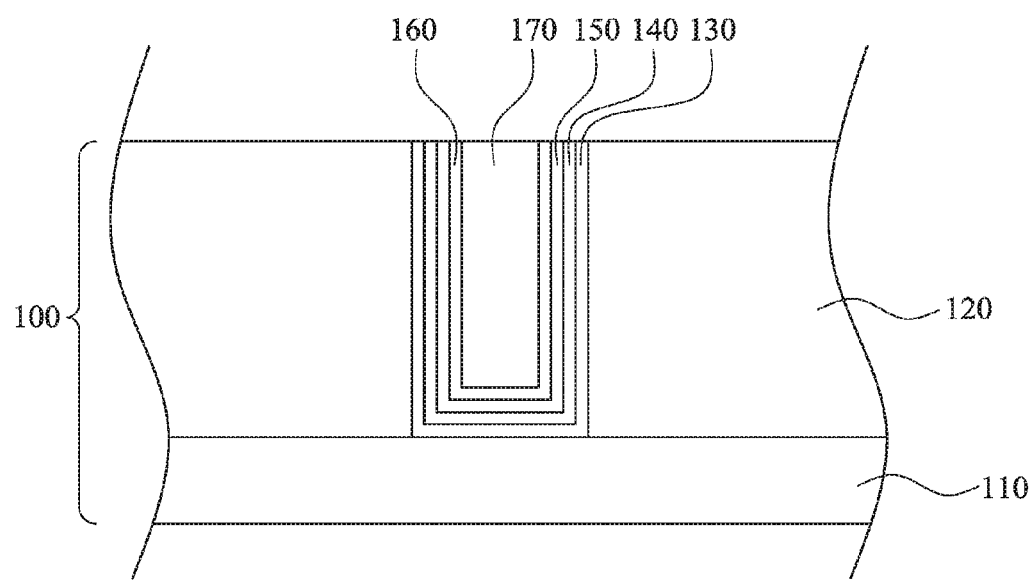
FIG. 1 is a diagrammatic fragmentary cross-sectional side views of an interconnect structure in a semiconductor device according to various embodiments of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a gate stack includes embodiments having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

As semiconductor device sizes continue to shrink, meeting conductivity requirements as well as reliability in multiple metallization fabrication has become increasingly more difficult. For example, the formation of an interconnect structure-which includes metal lines and conductive vias that interconnect metal lines from different layers-of integrated circuit (IC) devices generally requires a low resistance but also a sound barrier layer blocking the conductive metal in the conductive vias diffusing into the ILD layer. To lower the RC delay in the IC devices, the barrier layer also plays a significant role in governing the resistivity of interconnects.

In the known damascene process, the barrier layer and then a seed layer are deposited over the patterned dielectric layer surface before copper is introduced. Copper readily diffuses during operation in a phenomenon known as electromigration than can produce tendrils that can short adjacent conductive features. When in contact with silicon, copper damages the semiconductor device operation. Thus, the barrier layer is needed to prevent the copper from diffusing into the device region. Thin refractory metals or metal nitrides are usually selected for the barrier layer. Representative barrier layer materials include tantalum (Ta), tantalum nitride (TaN), tungsten (W), tungsten nitride (WN), titanium and titanium nitride (Ta/TaN). Of all of these barriers, Ta shows promise for barriers and has been used as the material of a barrier layer forming over a via hole to block the diffusion of conductive metal in the via hole into the ILD layer.

Tantalum exists as two phases, the low resistivity (15-30 $\mu\Omega \cdot cm$) α-phase (also referred to as the bcc or "body centered cubic" phase) and the higher resistivity (150-200 $\mu\Omega \cdot cm$) β-phase (tetragonal structure). When Ta is deposited by physical vapor deposition (PVD) process the β-phase forms readily. However, Ta having a crystallographic structure of β phase exhibits less satisfactory property in contact resistance. Methods of achieving the α-phase Ta are more difficult to reproduce and have been found to require heating the substrate, introduction of low level impurities into the film, and/or the use of specific base layers such as TaN between the dielectric and the Ta.

According to various embodiments of the present disclosure, an improved interconnect structure and a method for forming the interconnect structure is disclosed that allows the interconnect structure to achieve a lower Rc. To lower the Rc of the interconnect structure, an α-phase inducing metal layer is introduced on a first Ta barrier layer of β phase to induce the subsequent deposition of Ta thereon into the formation of an α-phase Ta barrier layer. The subsequently deposited Ta barrier layer with a primary crystallographic structure of α phase has a lower Rc than that of the β-phase Ta barrier layer.

Figure 2:
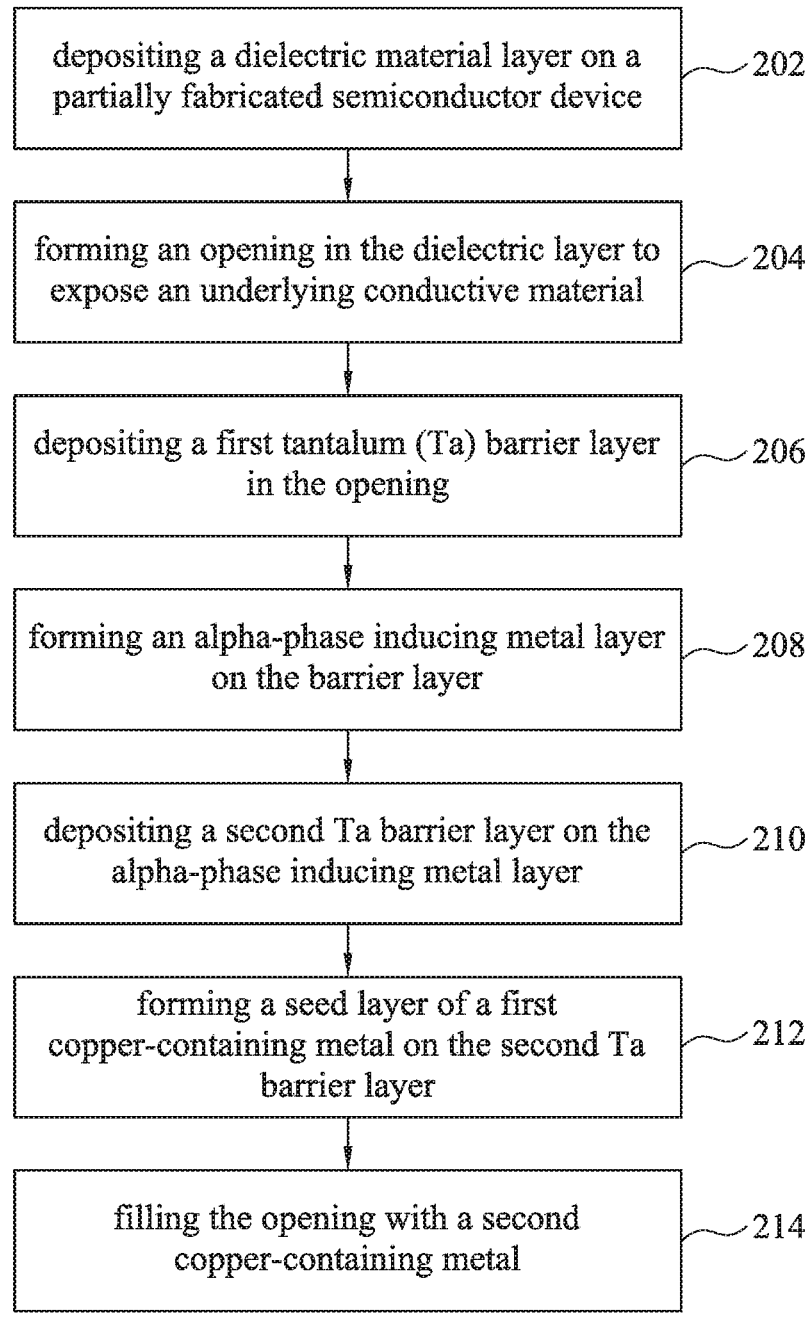
FIG. 2 is a flowchart illustrating a method of fabricating an interconnect structure according to various embodiments of the present disclosure.

To illustrate, FIG. 1 is a diagrammatic fragmentary cross-sectional side views of an interconnect structure in a semiconductor device according to various embodiments of the present disclosure. For reasons of simplicity, FIG. 1 may only illustrate a part of the interconnect structure, and any intermediate layers between the illustrated portion of the interconnect structure and the substrate 110 are omitted. The interconnect structure may be a portion of a semiconductor device in a wafer. FIG. 2 is a flowchart illustrating a method of fabricating an interconnect structure according to various embodiments of the present disclosure. The operation will be explained in the cross-sectional side views of a portion of an interconnect structure from FIGS. 3 to 9 at various fabrication stages according to various embodiments of the present disclosure. It is understood that FIGS. 1, and 3 to 9 have been simplified for a better understanding of the inventive concepts of the present disclosure.

FIG. 1 is an interconnect structure 100 that includes the substrate 110, the dielectric material layer 120 on the substrate 110, and a conductive feature. The conductive feature has a copper-containing metal 160/170, the α-phase Ta barrier layer 150, the α-phase inducing metal layer 140, and the β-phase Ta barrier layer 130. The copper-containing metal is at least partially and peripherally surrounded by the α-phase Ta barrier layer 150. The α-phase Ta barrier layer 150 is peripherally surrounded by the α-phase inducing metal layer 140. Further, the α-inducing metal layer is peripherally surrounded by the β-phase Ta barrier layer 130. The copper-containing metal may include the seed layer 160 different from or same as the second copper-containing metal 170 in composition. The seed layer is needed to provide the conductivity for the electrochemical deposition reaction and to provide nucleation sites for the subsequent copper electroplating. Usually, a thin copper layer is deposited over the barrier layer to serve as the seed layer. As various embodiments, the interconnect structure is a damascene or dual damascene structure.

One skilled in the art will realize the formation details of the metallization layers. A metallization layer may be formed overlying the ILD layer 120, which is a portion of conductive routes and has an exposed surface treated by a planarization process, such as chemical mechanical polishing (CMP) process, if necessary. The CMP process utilizes a slurry to help etch away the materials over the ILD layer 120, including the seed layer 160 and the copper-containing metal 170.

FIG. 2 is a flowchart of a method 200 of forming an interconnect structure 100 according to various embodiments of the present disclosure. Also referring to FIGS. 1-8, the method 200 includes an operation 202, in which a dielectric material layer 120 is deposited over a substrate 110. The dielectric material layer 120 may be an interlayer dielectric (ILD) and may contain an oxide material or a low-k material. The dielectric material layer 120 may be formed by, for example, a chemical vapor deposition (CVD) processing step, a spin-on processing step, or combination thereof. The dielectric layer 120 is provided to isolate conductive features formed on different and/or the same layers.

The method 200 includes an operation 204, in which an opening 125 is formed in the dielectric material layer 120. For various embodiments, there is a plurality of the openings formed in the dielectric material layer 120. The opening 125 may be, for example, contact openings, via openings, single damascene openings, dual damascene openings, or combinations thereof. The opening 125 may be formed, for example, by forming a patterned photoresist layer (not shown) over the dielectric material layer 120 and using a dry-etch processing step to remove portions of the dielectric material layer 120 to define the opening 125 by using the patterned photoresist layer (not shown) as a mask. Various suitable dry etch processes may be used. After the dry-etch processing step, the patterned photoresist layer (not shown) is removed by, for example, a photolithographic removal process.

The method 200 includes an operation 206, in which the opening 125 is deposited with a first Ta barrier layer 130 having β phase. In embodiments, the first Ta layer may be deposited by a chemical vapor deposition (CVD), physical vapor deposition (PVD), or atomic layer deposition (ALD).

In operation 208, an α-phase inducing metal layer 140 is formed on the first Ta barrier layer 130. As various embodiments, the α-phase inducing metal layer 140 is electrolessplating a metal layer selected from the group consisting of Cu, Cobalt (Co), Titanium (Ti), and Ruthenium (Ru). In embodiments, the α-phase inducing metal layer 140 may be in conformal deposition with substantially uniform thickness over the entire surface of the first Ta barrier layer 130, or only the bottom of the first Ta barrier layer 130.

In operation 210, a second Ta layer is deposited on the α-phase inducing metal layer 140 and thus having α phase layer 150. In embodiments, the second Ta layer may be deposited by a CVD, PVD, or ALD.

Further, the method 200 includes an operation 212, in which a seed layer of a first copper-containing metal 160 is formed on the second Ta barrier layer 150 through a process such as an electroplating process.

In operation 214, the opening 125 a second copper-containing metal is filled with a metal material. The metal material may be formed in a suitable deposition process. Electroplating processes are generally used to deposit copper because such processes have better gap filling capability as compared to PVD or CVD. The PVD techniques include, for example, various evaporation and sputtering techniques, such as DC and/or RF plasma sputtering, bias sputtering, magnetron sputtering, ion plating, or ionized metal plasma sputtering. PVD processes generally produce non-conformal deposition due to their anisotropic and directional nature. The CVD techniques include, for example, thermal CVD, plasma enhanced CVD, low pressure CVD, high pressure CVD, and metal-organo CVD. CVD processes most frequently produce conformal deposition with substantially uniform thickness over the entire surface, including over the field and the bottom and sidewall surfaces of the openings.

The method 200 may further includes a chemical-mechanical (CMP) process an electropolishing step, a dry etch step, or combinations thereof, which is performed to remove portions of the metal material over the dielectric layer. The second Cu-containing metal and the seed layer of the first Cu-containing metal are partially removed by a CMP processing step, an electropolishing step, a dry etch step, or combinations thereof. A multi-step CMP process may be required to remove the second Cu-containing metal 170, the seed layer 160 and the Ta barrier layers 150/130 formed over the surface of the dielectric layer 120. In short, a separate CMP step is used to remove the Ta barrier layer formed over the dielectric layer 120 for isolating two adjacent contacts, vias and/or damascenes.

Figure 3:
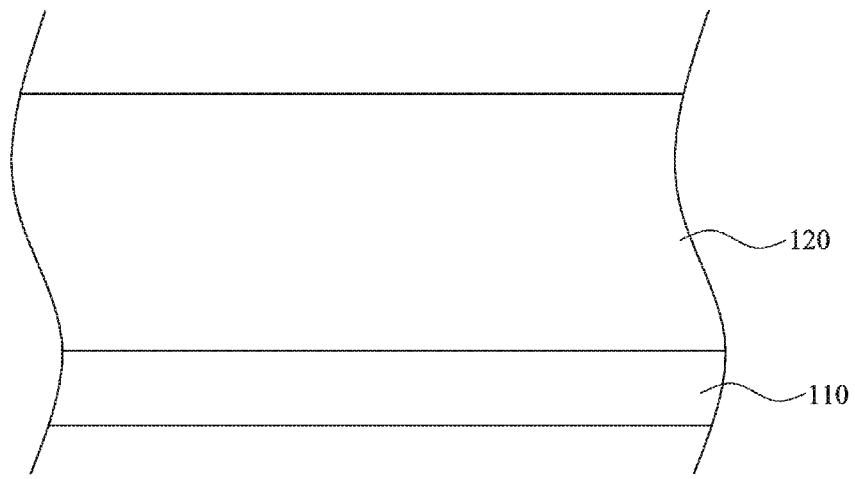
FIGS. 3-9 are diagrammatic fragmentary cross-sectional side views of the interconnect structure of FIG. 1 at various stages of fabrication according to various embodiments of the present disclosure.

In FIG. 3, a substrate 110 is provided with a dielectric material layer 120 thereover. Referring to the operation 202 of FIG. 2, the substrate 110 is a silicon substrate doped with either a P-type dopant such as boron, or doped with an N-type dopant such as phosphorous or arsenic. The substrate 110 may alternatively include other elementary semiconductors such as germanium and diamond. The substrate 110 may optionally include a compound semiconductor and/or an alloy semiconductor. Further, the substrate 110 may include an epitaxial layer (epi layer), may be strained for performance enhancement, and may include a silicon-on-insulator (SOI) structure. The dielectric material layer 120, also referred to as an interlayer dielectric (ILD) layer. The ILD layer 120 may include dielectric materials such as oxide, nitride, a low-k dielectric material, or another suitable material. The ILD layer 120 may include one or more dielectric materials and/or one or more dielectric layers.

Figure 4:
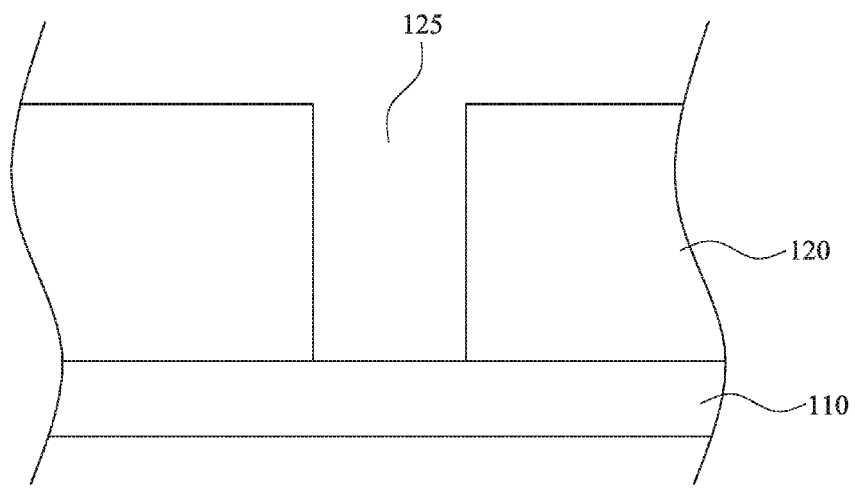

In FIG. 4, an opening 125 is formed through the dielectric material layer 120 to the substrate 110. Referring to the operation 204, in the formation of the opening 125, a layer of photoresist (not shown) is formed over the ILD layer 120 by a suitable process, such as spin-on coating, and patterned to form a patterned photoresist feature by a lithography patterning method. The patterned photoresist feature can then be transferred using a dry etching process to etch the opening 125 for contacts through the dielectric material layer 120. The photoresist layer is stripped thereafter. The opening 125 is configured to be filled with conductive feature to provide electrical connections between microelectronic components of a semiconductor device (for example, transistor devices) and external devices.

Figure 5:
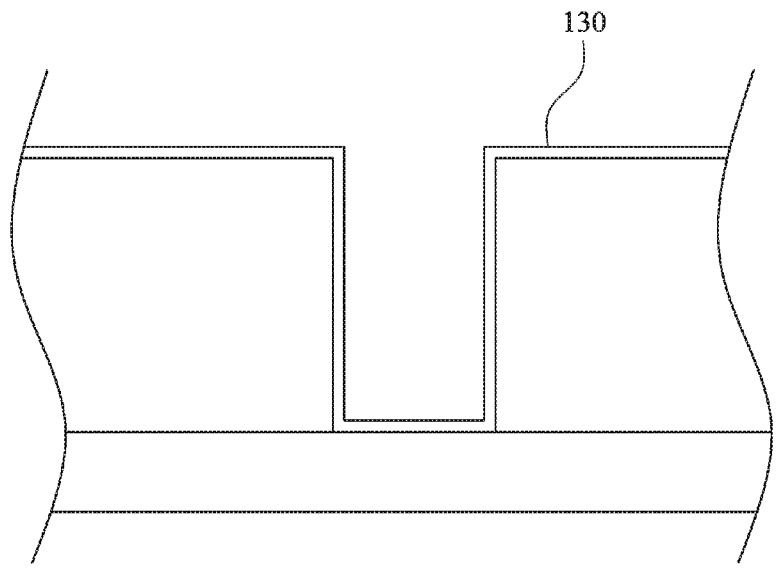

Referring to FIG. 5 and the operation 206 of FIG. 2, a first tantalum (Ta) barrier layer 130 is formed over the opening 125 as well as the dielectric material layer 120 through a suitable deposition process, such as physical vapor deposition (PVD), chemical vapor deposition (CVD), atomic layer deposition (ALD), combination thereof, or another suitable process. The first Ta barrier layer 130 may have a crystallographic structure of beta (β) phase, which shows high contact resistance. For various embodiments of the present disclosure, the first Ta barrier layer 130 with β phase has a thickness between about 10 and 100 angstroms. As embodiments of the present disclosure, the first Ta barrier layer 130 with β phase has a thickness between about 50 and 85 angstroms.

Figure 6:
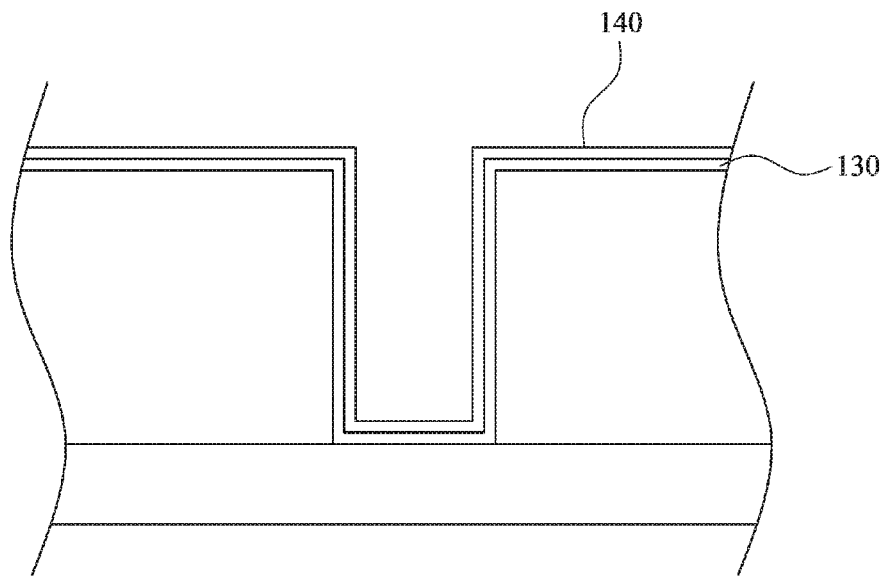

Referring to FIG. 6 and the operation 208 of FIG. 2, an alpha (α)-phase inducing metal layer is deposited on the first Ta barrier layer 130 through a suitable deposition process like an electroplating process, or that for the first Ta barrier layer 130. As embodiments, the α-phase inducing metal layer is formed at least over the first Ta barrier layer 130 at a bottom of the opening 125 (i.e. the exposed surface of the substrate 110). The α-phase inducing metal layer 140 is so named for the layer is introduced on the first Ta barrier layer in order to induce the formation of a subsequently deposited Ta barrier layer having a primary crystallographic structure of α phase, which has a lower Rc than that of the β-phase Ta. The candidate materials are those capable of inducing the formation of the α-phase Ta barrier layer. For example, the α-phase inducing metal layer is formed from a metal selected from the group consisting of Cu, Cobalt (Co), Titanium (Ti), and Ruthenium (Ru). For various embodiments of the present disclosure, the alpha-phase inducing metal layer has a thickness between about 5 and 60 angstroms. As embodiments, the alpha-phase inducing metal layer has a thickness between about 15 and 50 angstroms.

Figure 7:
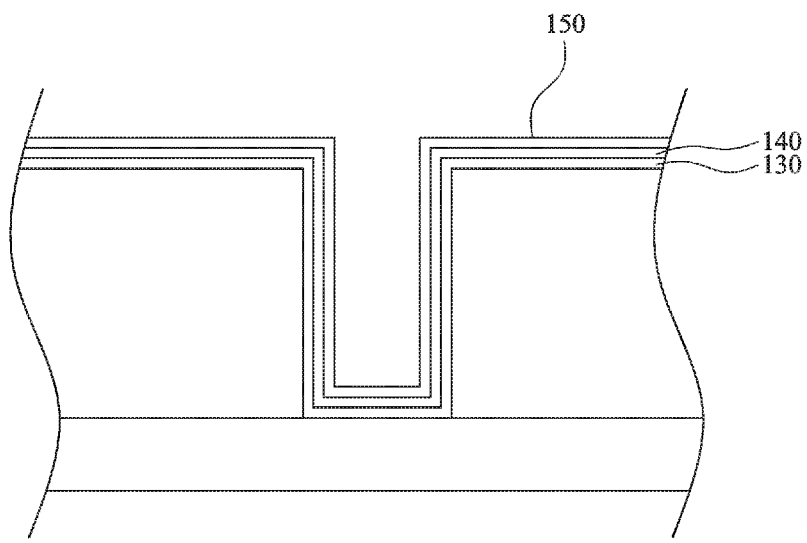

In FIG. 7 and the operation 210 of FIG. 2, a second Ta barrier layer 150 is deposited over the α-phase inducing metal layer 140. For various embodiments of the present disclosure, the second Ta barrier layer 150 with α phase has a thickness between about 5 and 60 angstroms. As embodiments of the present disclosure, the second Ta barrier layer 150 with α-phase has a thickness between about 5 and 20 angstroms.

Figure 8:
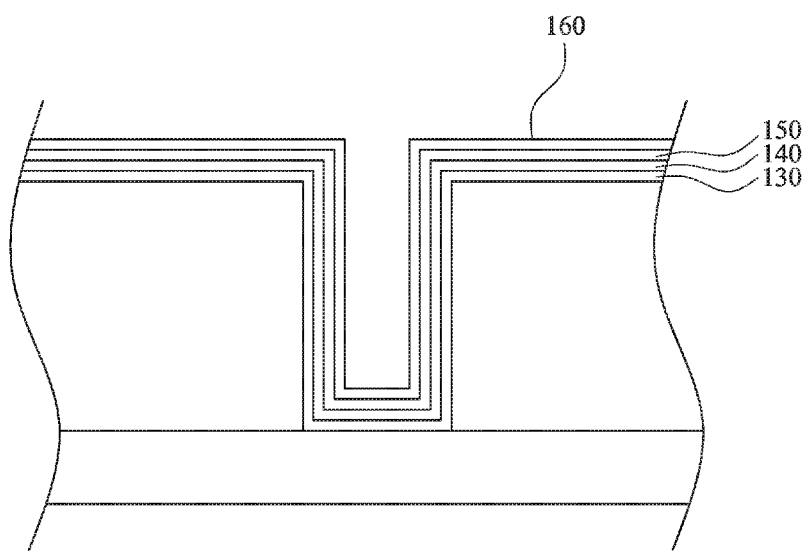

Usually, a thin copper layer is deposited over the barrier layer to serve as the seed layer. In FIG. 8 and the operation 212 of FIG. 2, a seed layer 160 is deposited over the second Ta barrier layer 150. The seed layer 160 may be formed by, for example, a PVD process, a CVD process, an ALD process, an electroplating, an electroless plating or a combination thereof. The seed layer 160 is needed to provide the conductivity for the electrochemical deposition reaction and to provide nucleation sites for the subsequent copper electroplating. The seed layer 160 is made of a first copper-containing metal selected from the group consisting of copper (Cu), copper magnesium (CuMg), copper aluminum (CuAl), copper manganese (CuMn), copper titanium (CuTi), copper silicon (CuSi), copper tungsten (CuW), copper tantalum (CuTa), copper zirconium (CuZr), copper molybdenum (CuMo), and combinations thereof.

Figure 9:
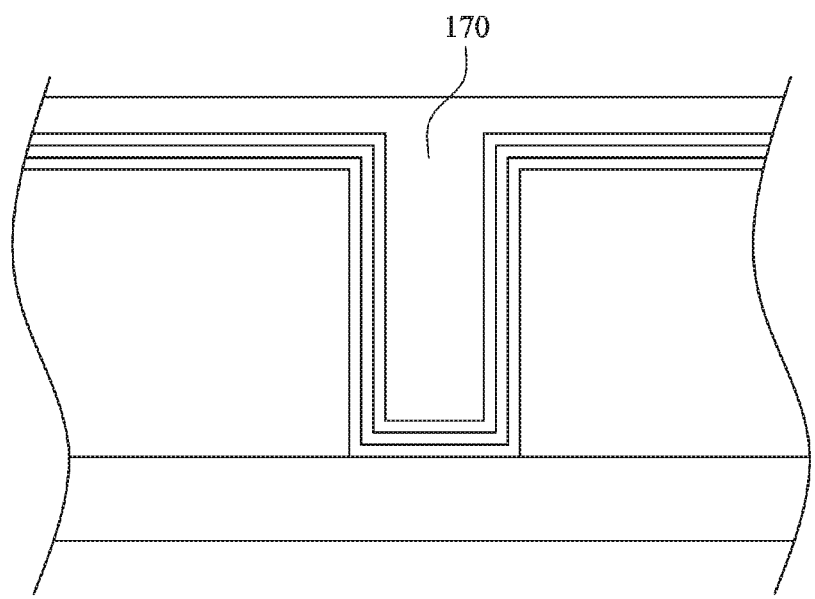

Referring to FIG. 9 and the operation 214 of FIG. 2, a second copper-containing metal 170 is filled in the opening 125. The second copper-containing metal is a metal selected from the group consisting of Cu, CuMg, CuAl, CuMn, CuTi, CuSi, CuW, CuTa, CuZr, CuMo, and combinations thereof.

Based on an X-ray diffraction (XRD) analysis, a nanocrystalline microstructure of the barrier layer 150 was identified with α-phase Ta structure. The predominant (110) oriented α-phase Ta barrier layer 150 is characterized by an x-ray diffraction peaks at 2Θ=38°. The XRD analysis indicates that a α-phase Ta layer is successfully induced by and formed on the α-phase inducing copper layer, which is introduced first on the β-phase Ta barrier layer.

Normally, with the PVD process, a conductive feature in an interconnect with a Ta barrier layer of a thickness of 200 angstroms has a nearly 20% lower Rc than that of conventional the interconnect structure with only the β-phase Ta barrier layer. 20%.

Given the above, according to various aspects of the present disclosure, an interconnect structure includes a substrate, a dielectric material layer on the substrate, and a conductive feature in the dielectric layer. The conductive feature has a Cu-containing metal, an alpha-phase Ta barrier layer at least partially, peripherally surrounding the Cu-containing metal, an α-phase inducing metal layer peripherally surrounding the α-phase Ta barrier layer and a β-phase Ta barrier layer peripherally surrounding the α-phase inducing metal layer. The interconnect structure may further includes another conductive feature overlying or underlying the conductive feature.

In embodiments, the α-phase Ta barrier layer has a thickness of between about 5 and about 60 angstroms. The α-phase inducing metal layer may have a thickness between about 5 and 60 angstroms. The β-phase Ta barrier layer may have a thickness of between about 10 and about 100 angstroms. As various embodiments, the Cu-containing metal may be selected from the group consisting of Cu, copper magnesium (CuMg), copper aluminum (CuAl), copper manganese (CuMn), copper titanium (CuTi), copper silicon (CuSi), copper tungsten (CuW), copper tantalum (CuTa), copper zirconium (CuZr), copper molybdenum (CuMo), and combinations thereof.

In embodiments, the α-phase inducing metal layer may be disposed at least over the β-phase Ta barrier layer at a bottom of the opening. The α-phase inducing metal layer may be made of a metal selected from the group consisting of Cu, Cobalt (Co), Titanium (Ti), and Ruthenium (Ru).

According to various aspects of the present disclosure, an integrated circuit device includes a substrate, a plurality of inter-layer dielectric layer on the substrate, and a plurality of conductive features each has a β-phase Ta barrier layer, an α-phase inducing metal layer on the β-phase Ta barrier layer, an α-phase Ta barrier layer on the α-phase inducing metal layer, and a Cu-containing metal on the α-phase Ta barrier layer. The respective conductive features are correspondingly in the respective dielectric layers.

According to various aspects of the present disclosure, a method for forming an interconnect structure includes the following operations. A dielectric material layer is deposited on a substrate. An opening in the dielectric layer is formed to expose an underlying conductive material. Also, a conductive feature is formed. In the forming the conductive feature, a first Ta barrier layer is deposited in the opening; an α-phase inducing metal layer is formed on the first Ta barrier layer; a second Ta barrier layer is deposited on the α-phase inducing metal layer; and the opening is filled with a second Cu-containing metal.

The embodiments of the present disclosure discussed above have advantages over existing structures and methods. The α-phase inducing metal layer formed at least over the first Ta barrier layer at a bottom of the opening, which induces the formation of a subsequently deposited Ta barrier layer having the primary crystallographic structure of α phase having a lower Rc than that of the β-phase Ta barrier layer. It is understood, however, that other embodiments may have different advantages, and that no particular advantage is required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming an interconnect structure, the method comprising:
   depositing a dielectric layer on a substrate;
   forming an opening in the dielectric layer; and
   forming a conductive feature, comprising:
      depositing a first Ta barrier layer in the opening;
      forming an alpha (α)-phase inducing metal layer on the first Ta barrier layer such that the α-phase inducing metal layer covers only a bottom surface of the first Ta barrier layer;
      forming a second Ta barrier layer on the α-phase inducing metal layer;
      forming a seed layer on the second Ta barrier layer; and
      filling the opening with a conductive layer.

2. The method of claim 1, wherein at least one of the depositing of the first Ta barrier layer and the forming of the second Ta barrier layer is performed by a chemical vapor deposition (CVD), physical vapor deposition (PVD), or atomic layer deposition (ALD).

3. The method of claim 1, wherein the forming of the seed layer includes a PVD process, a CVD process, an ALD process, an electroplating, an electroless plating, or a combination thereof.

4. The method of claim 1, wherein the filling of the opening with the conductive layer includes electroplating or electroless plating a metal selected from the group consisting of copper (Cu), copper magnesium (CuMg), copper aluminum (CuAl), copper manganese (CuMn), copper titanium (CuTi), copper silicon (CuSi), copper tungsten (CuW), copper tantalum (CuTa), copper zirconium (CuZr), copper molybdenum (CuMo), and combinations thereof.

5. The method of claim 1, further comprising repeating the forming of the conductive feature to form a second conductive feature overlying the conductive layer.

6. The method of claim 1, wherein the forming of the α-phase inducing metal layer includes electroplating a metal layer selected from the group consisting of Cu, Cobalt (Co), Titanium (Ti), and Ruthenium (Ru).

7. The method of claim 1, wherein the forming of the α-phase inducing metal layer includes electroless-plating a metal layer selected from the group consisting of Cu, Co, Ti, and Ru.

8. The method of claim 1, further comprising partially removing the conductive layer and the seed layer to expose the first or second Ta barrier layer.

9. The method of claim 8, wherein the partially removing of the conductive layer and the seed layer comprises a chemical-mechanical polishing (CMP) process or an electropolishing process.

10. The method of claim 1, wherein the first Ta barrier layer has a resistivity higher than that of the second Ta barrier layer.

11. The method of claim 1, wherein the seed layer is different from the conductive layer in composition.

12. A method of forming a conductive feature in a semiconductor structure, the method comprising:
   forming a beta (β)-phase Ta barrier layer in an opening in a dielectric layer on a semiconductor substrate;
   depositing an alpha (α)-phase inducing metal layer only on a bottom surface of the beta (β)-phase Ta barrier layer;
   growing an alpha (α)-phase Ta barrier layer on the alpha (α)-phase inducing metal layer;
   forming a seed layer over the alpha (α)-phase Ta barrier layer; and
   filling the opening with a conductive layer.

13. The method of claim 12, wherein the seed layer is different from the conductive layer in composition.

14. The method of claim 12, further comprising forming a second conductive feature overlying or underlying the conductive feature.

15. The method of claim 12, wherein the beta (β)-phase Ta barrier layer has a resistivity higher than that of the alpha (α)-phase Ta barrier layer.

16. A method of forming a semiconductor structure, the method comprising:
   forming an opening in a dielectric layer;
   depositing a beta (β)-phase Ta barrier layer in the opening;

depositing an alpha (α)-phase inducing metal layer over the beta (β)-phase Ta barrier layer such that the alpha (α)-phase inducing metal layer is formed only over a bottom surface of the beta (β)-phase Ta barrier layer;

depositing an alpha (α)-phase Ta barrier layer over the alpha (α)-phase inducing metal layer; and depositing a seed layer on the alpha (α)-phase Ta barrier layer; and filling the opening with a conductive layer.

17. The method of claim 16, wherein the alpha (α)-phase Ta barrier layer is deposited to a thickness in a range of 5 to 60 angstroms.

18. The method of claim 16, wherein the beta (β)-phase Ta barrier layer is deposited to a thickness in a range of 10 to 100 angstroms.

19. The method claim 16, wherein the alpha (α)-phase inducing metal layer is deposited to a thickness in a range of 15 to 50 angstroms.

20. The method of claim 16, wherein the beta (β)-phase Ta barrier layer has a resistivity higher than that of the alpha (α)-phase Ta barrier layer.

\* \* \* \* \*